(12) United States Patent
Kim et al.

(10) Patent No.: US 11,148,185 B2
(45) Date of Patent: Oct. 19, 2021

(54) METHOD OF MOLDING BACK COVER OF DISPLAY AND DIE FOR MOLDING BACK COVER

(71) Applicant: OHSUNG DISPLAY CO., LTD., Busan (KR)

(72) Inventors: Sun Gyu Kim, Yangju-si (KR); Sa Sung Kim, Gumi-si (KR)

(73) Assignee: OHSUNG DISPLAY CO., LTD., Busan (KR)

( * ) Notice: Subject to any disclaimer, the term of this patent is extended or adjusted under 35 U.S.C. 154(b) by 628 days.

(21) Appl. No.: 15/626,157

(22) Filed: Jun. 18, 2017

(65) Prior Publication Data

US 2018/0214922 A1   Aug. 2, 2018

(30) Foreign Application Priority Data

Jan. 31, 2017  (KR) .................... 10-2017-0013612

(51) Int. Cl.
*B21D 19/08*   (2006.01)
*B21D 19/12*   (2006.01)
(Continued)

(52) U.S. Cl.
CPC ............. *B21D 19/08* (2013.01); *B21D 19/12* (2013.01); *H01L 27/3244* (2013.01);
(Continued)

(58) Field of Classification Search
CPC ...... B21D 19/02; B21D 19/08; B21D 19/082; B21D 19/12; B21D 19/14; B21D 51/12;
(Continued)

(56) References Cited

U.S. PATENT DOCUMENTS 2,433,040 A * 12/1947 Geist ...................... B21D 19/12
                                                              72/354.2
2,968,270 A *  1/1961 McChesney ........... B21D 19/12
                                                              72/354.8
(Continued)

FOREIGN PATENT DOCUMENTS

CN        201558898 U     8/2010
FR        3025443 A1 *    3/2016  ............. B21D 19/08
(Continued)

*Primary Examiner* — Teresa M Ekiert
(74) *Attorney, Agent, or Firm* — Novick, Kim & Lee, PLLC; Sang Ho Lee

(57) ABSTRACT

A method of molding a back cover of a display and a die for molding the back cover are provided. More particularly, a method of finishing a side of a display by using a back cover is provided. A die for molding a back cover of a display includes: an upper die in which a lower inner side thereof has a fan shape with a certain curvature, and an inner side of the fan shape has a flat shape; a first lower die which is disposed below the upper die and in which an upper inner side thereof has a shape corresponding to the fan shape formed in the upper die, and an inner side of the fan shape is dent downward by a certain length; and a second lower die in which an upper portion thereof has a flat shape, and an end upper portion thereof protrudes toward the first lower die by a certain length.

11 Claims, 9 Drawing Sheets

(51) Int. Cl.
  *B21D 51/52*  (2006.01)
  *H01L 27/32*  (2006.01)
  *H01L 51/52*  (2006.01)
  *H01L 51/56*  (2006.01)

(52) U.S. Cl.
  CPC ............ *H01L 51/524* (2013.01); *B21D 51/52* (2013.01); *H01L 51/5237* (2013.01); *H01L 51/56* (2013.01)

(58) Field of Classification Search
  CPC  B21D 51/2615; B21D 51/2623; B21D 51/38; B21D 22/06; B21D 22/20; B21D 22/30
  See application file for complete search history.

(56) References Cited

U.S. PATENT DOCUMENTS

| | | | | |
|---|---|---|---|---|
| 3,685,340 | A | * | 8/1972 | Lamm .................... B21D 19/12 72/398 |
| 4,606,472 | A | * | 8/1986 | Taube .................... B21D 51/44 220/500 |
| 4,651,892 | A | * | 3/1987 | Boersma .............. B65D 45/345 220/320 |
| 7,258,030 | B2 | * | 8/2007 | McCallum ........... B21D 19/086 74/122 |
| 8,402,804 | B2 | * | 3/2013 | Nakao ................... B21D 22/06 72/347 |

FOREIGN PATENT DOCUMENTS

| KR | 10-2014-0094694 A | 7/2014 |
|---|---|---|
| KR | 10-2016-0019751 A | 2/2016 |

\* cited by examiner

METHOD OF MOLDING BACK COVER OF DISPLAY AND DIE FOR MOLDING BACK COVER

CROSS-REFERENCE(S) TO RELATED APPLICATION

This application claims priority of Korean Patent Application No. 10-2017-0013612, filed on Jan. 31, 2017, in the Korean Intellectual Property Office, which is hereby incorporated by reference in its entirety.

BACKGROUND OF THE INVENTION

Field of the Invention

The present invention relates to a method of molding a back cover of a display and a die for molding the back cover, and more particularly, to a method of finishing a side of a display by using a back cover.

Description of the Related Art

An OLED display is a self-luminous display in which each pixel emits light without any backlight. Generally, the OLED display includes an encap (encapsulation film), an OLED, a color refiner on TFT (CRT), glass, and an anti reflection film (ARF).

Generally, the OLED includes electrodes and an organic layer. When power is supplied to the OLED, holes and electrons provided from the electrodes are injected into the organic layer. The holes and the electrons recombine in the organic layer to produce excitons. These excitons return to a ground state to emit light. When oxygen or moisture is introduced into the OLED, the lifespan of the OLED is shortened and the luminous efficiency of the OLED is reduced. Therefore, in manufacturing an organic light-emitting display device, an encapsulation process is performed to form an encapsulation structure for preventing oxygen or moisture from penetrating an OLED panel including an OLED.

FIG. 1 illustrates a structure of a general display. Referring to FIG. 1, the display includes a back cover, a cabinet, a pad, and a panel. The back cover and the cabinet constituting the display are coupled to each other by using a double-sided tape as illustrated in FIG. 1. That is, the back cover and the cabinet are coupled to each other by inserting the double-sided tape between the back cover and the cabinet.

That is, in order to prevent side surfaces of the back cover and the pad from being exposed to the outside, a separate cabinet (middle cabinet (M/C)) is required. This causes an increase in unit cost of a product and needs a separate process.

SUMMARY OF THE INVENTION

An aspect of the present invention is to provide a method of finishing a side of a display by using a back cover.

Another aspect of the present invention is to provide a manufacturing process capable of improving rigidity of a display and easily finishing a side of the display.

Another aspect of the present invention is to provide a method of manufacturing a display, capable of reducing manufacturing costs.

According to an embodiment of the present invention, a die for molding a back cover of a display includes: an upper die in which a lower inner side thereof has a fan shape with a certain curvature, and an inner side of the fan shape has a flat shape; a first lower die which is disposed below the upper die and in which an upper inner side thereof has a shape corresponding to the fan shape formed in the upper die, and an inner side of the fan shape is dent downward by a certain length; and a second lower die in which an upper portion thereof has a flat shape, and an end upper portion thereof protrudes toward the first lower die by a certain length.

According to an embodiment of the present invention, a die for molding a back cover of a display includes: a first upper die which is formed in a rod type and has a lower portion having an inclined shape so as to form an arrow shape; a second upper die which is disposed on the right of the first upper die and has a lower portion having a flat shape; a first lower die which has an upper portion cut in a triangular shape so as to correspond to the inclined shape of the first upper die; and a second lower die which has an upper portion having a flat shape, wherein an end upper portion of the second lower die protrudes toward the first lower die by a certain length, and an end of a protruding portion has an inclined shape so as to correspond to the inclined shape of the first upper die.

According to an embodiment of the present invention, a die for molding a back cover of a display includes: an upper die in which a lower inner side thereof has a fan shape and an inner side of the fan shape has a flat shape; a first lower die in which an upper inner side thereof has a shape corresponding to the fan shape formed in the upper die, an inner side of the corresponding shape is dent downward by a certain length, and a portion coming into close contact with the second lower die has a fan shape with a certain curvature; and a second lower die in which an upper portion thereof has a flat shape.

According to an embodiment of the present invention, a die for molding a back cover of a display includes: an upper die which has a lower surface having a first portion having a fan shape with a certain curvature, a second portion extending from the first portion and having an inclined shape, and a third portion extending from the second portion and having a flat shape; a first lower die which is disposed on a lower left side of the upper die and has an upper surface having an "a" portion having a fan shape with a certain curvature and a "b" portion extending from the "a" portion and having an inclined shape; and a second lower die which is disposed on a lower right side of the upper die and has an upper portion having a flat shape.

DETAILED DESCRIPTION OF EMBODIMENTS

The above-described aspects and additional aspects of the present invention other aspects will become apparent from the following description of the embodiments, taken in conjunction with the accompanying drawings. Hereinafter, the present invention will be described in detail so that those skilled in the art can easily understand and implement the present invention through these embodiments.

Figure 1:
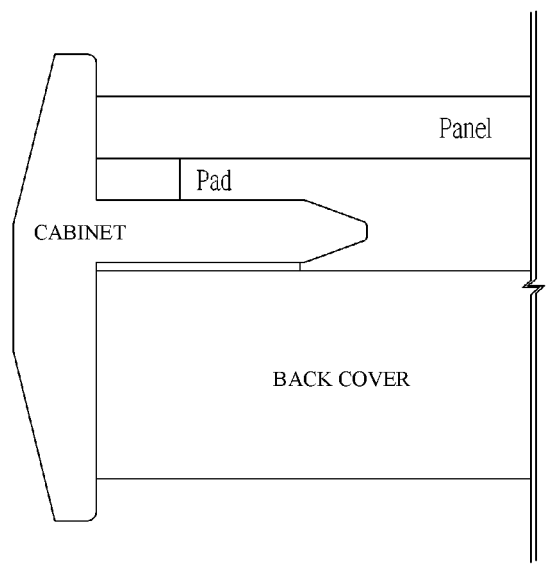
FIG. 1 illustrates a structure of a general display.
Figure 2:
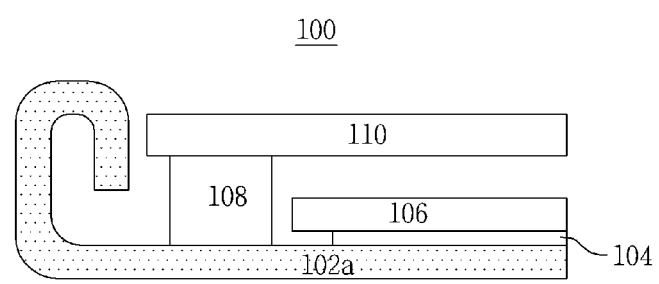
FIG. 2 illustrates a shape of a back cover in a display according to an embodiment of the present invention.

FIG. 2 illustrates a shape of a back cover in a display according to an embodiment of the present invention. Hereinafter, the shape of the back cover in the display according to the embodiment of the present invention will be described with reference to FIG. 2.

Referring to FIG. 2, the display 100 includes a back cover 102a, a first double-sided tape 104, an inner plate 106, a second double-sided tape 108, and a panel 110. In addition to the components described above, other components may be included in the display 100 according to the present invention.

The back cover 102a is disposed in a lowermost portion of the display 100. As illustrated in FIG. 2, an end of the back cover 102a is hemmed. Due to the hemmed end of the back cover 102a, a side of the display 100 is finished by the back cover 102a. The first double-sided tape 104 is formed on an upper surface of the back cover 102a. The first double-sided tape 104 bonds the back cover 102a and the inner plate 106.

In addition, the second double-sided tape 108 is formed on the upper surface of the back cover 102a. A thickness of the second double-sided tape 108 is greater than the sum of a thickness of the first double-sided tape 104 and a thickness of the inner plate 106. The second double-sided tape 108 bonds the back cover 102a and the panel 110. The second double-sided tape 108 bonds the back cover 102a and the panel 110 at a relatively outer position than the first double-sided tape 104.

As described above, the back cover 102a is hemmed, and the side of the display is finished by using the hemmed back cover 102a.

Figure 3A:
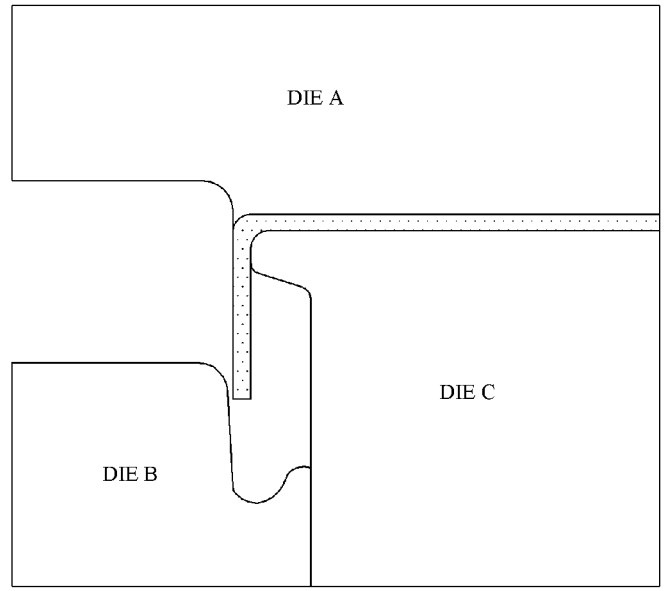
FIGS. 3A to 3C illustrate a die for hemming a back cover and a process of manufacturing the back cover, according to an embodiment of the present invention.
Figure 3B:
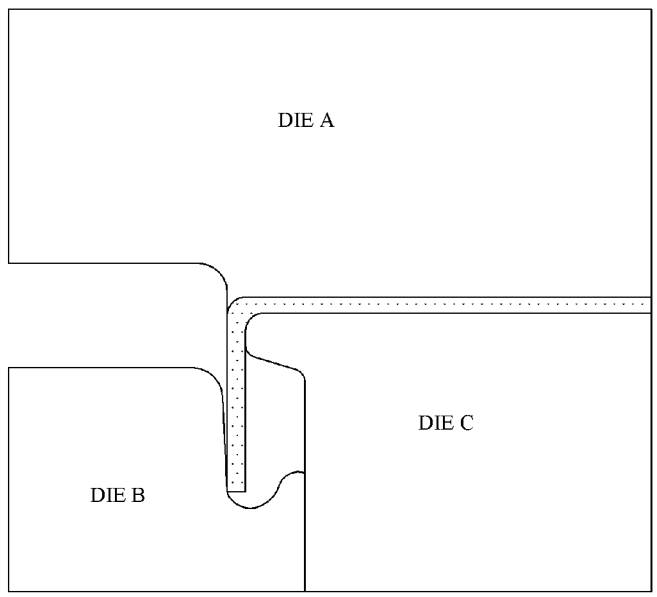
Figure 3C:
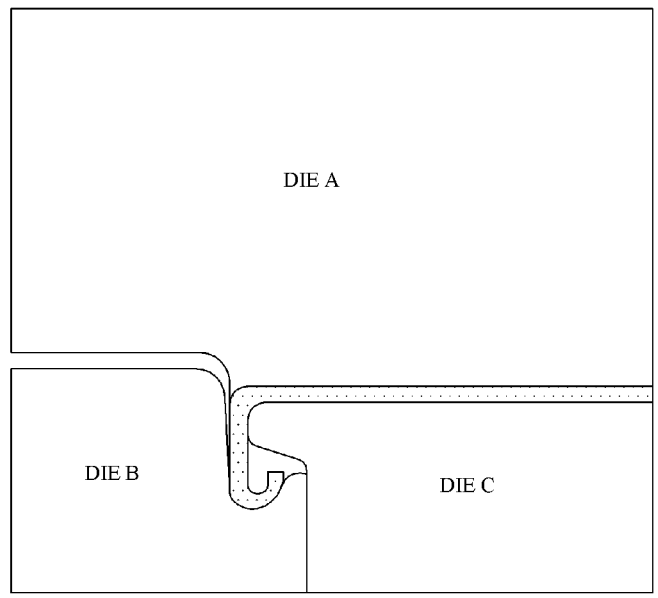

FIGS. 3A to 3C illustrate a die for hemming a back cover and a process of manufacturing the back cover, according to an embodiment of the present invention. Hereinafter, the die for hemming the back cover and the process of manufacturing the back cover, according to the embodiment of the present invention, will be described with reference to FIGS. 3A to 3C.

Referring to FIG. 3A, the die for hemming the back cover includes three dies, i.e., an upper die (die A), a first lower die (die B), and a second lower die (die C). The upper die is disposed on an upper side of the die, the first lower die is disposed on a lower left side of the die, and the second lower die is disposed on a lower right side of the die.

A lower inner side of the upper die has a fan shape with a certain curvature, and an inner side of the fan shape has a flat shape. A portion connecting a portion of the upper die having a flat shape and a portion of the upper die having a fan shape has a fan shape so as to guide the bending of the back cover.

An upper inner side of the first lower die has a shape corresponding to the fan shape formed in the upper die. An inner side of the shape corresponding to the fan shape has a shape dented downward by a certain length. A portion coming into close contact with the second lower die has a fan shape with a certain curvature. The back cover is hemmed due to the fan shape formed in the first lower die. Therefore, it is possible to manufacture a back cover having various hemmed shapes according to a radius of the fan shape formed in the first lower die.

An upper portion of the second lower die has a flat shape, and an end upper portion of the second lower die protrudes toward the first lower die by a certain length. The protruding length of the second lower die is changed according to the radius of the fan shape formed in the first lower die. That is, when the radius of the fan shape formed in the first lower die increases, the length protruding toward the first lower die also increases.

An unhemmed portion of the back cover is disposed between the upper die and the second lower die, and a hemmed portion of the back cover is disposed between the first lower die and the second lower die.

The upper die and the second lower die move downward in a state in which the back cover is disposed between the upper die, the first lower die, and the second lower die.

Referring to FIG. 3B, as the upper die and the second lower die move downward, an end of the back cover comes into contact with the fan shape of the first lower die. In this state, when the upper die and the second lower die move downward, the end of the back cover starts to be bent.

Referring to FIG. 3C, when the downward movement of the upper die and the second lower die is completed, the end of the back cover has a bent shape.

As described above, the present invention provides the method of hemming the back cover by using the divided dies.

Figure 4:
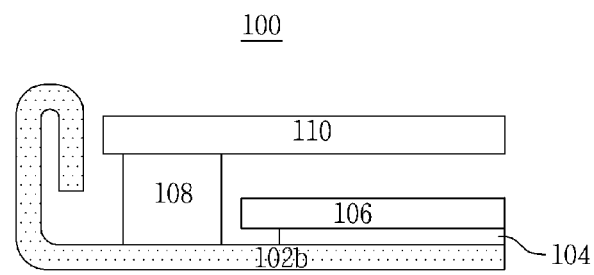
FIG. 4 illustrates a display according to another embodiment of the present invention.

FIG. 4 illustrates a display according to another embodiment of the present invention. The display 100 of FIG. 4 is substantially the same as the display 100 of FIG. 2 except for a hemmed shape of a back cover 102b. In addition, a die for hemming the back cover 102b is substantially the same as the die of FIG. 2 except for a fan shape of a first lower die. That is, a shape of the back cover 102b is changed according to a curvature (radius) of the fan shape of the first lower die.

Figure 5:
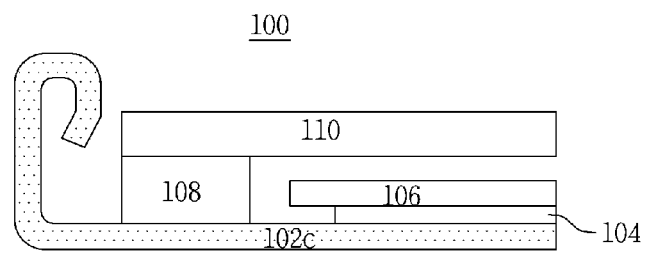
FIG. 5 illustrates a display according to another embodiment of the present invention.

FIG. 5 illustrates a display according to another embodiment of the present invention. The display 100 of FIG. 5 is substantially the same as the display 100 of FIG. 2 except for a hemmed shape of a back cover 102c. A manufacturing process is performed by using the back cover 102c having an end bent by a certain angle.

The hemmed back cover 102b of FIG. 4 and the hemmed back cover 102c of FIG. 5 are manufactured by using the die illustrated in FIGS. 3A to 3C.

Figure 6:
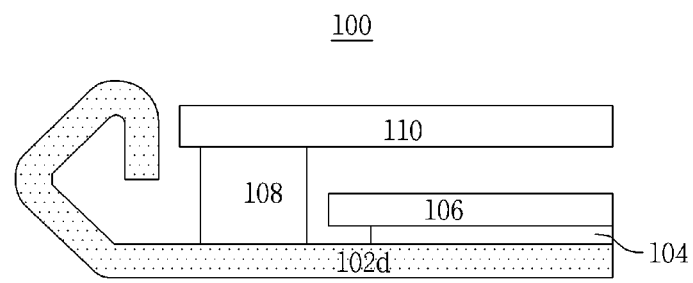
FIG. 6 illustrates a structure of a display according to another embodiment of the present invention.

FIG. 6 illustrates a structure of a display 100 according to another embodiment of the present invention. The display 100 of FIG. 6 differs from the display 100 of FIG. 2 in terms of a hemmed shape of a back cover 102d. That is, the hemmed shape of the back cover 102d of FIG. 6 is an arrow shape.

Figure 7A:
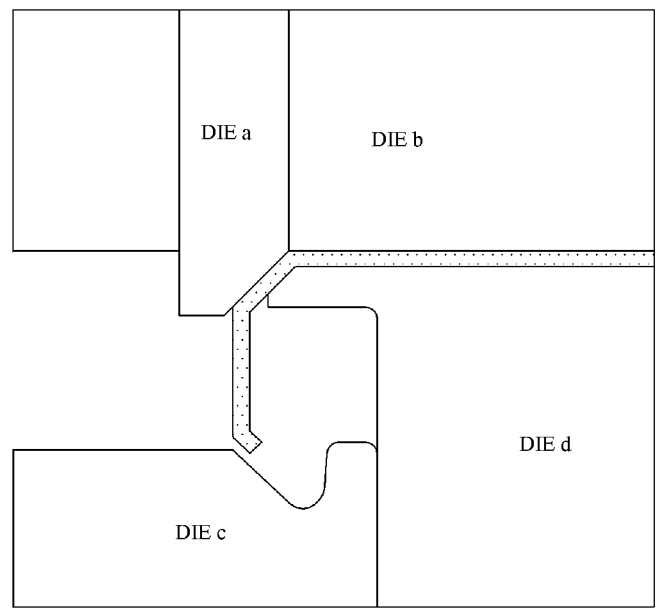
FIGS. 7A to 7C illustrate a die for hemming a back cover and a process of manufacturing the back cover, according to another embodiment of the present invention.
Figure 7B:
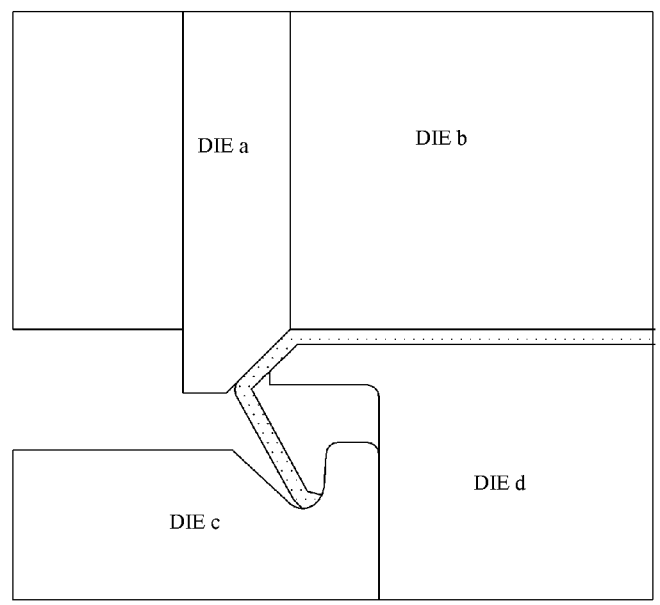
Figure 7C:
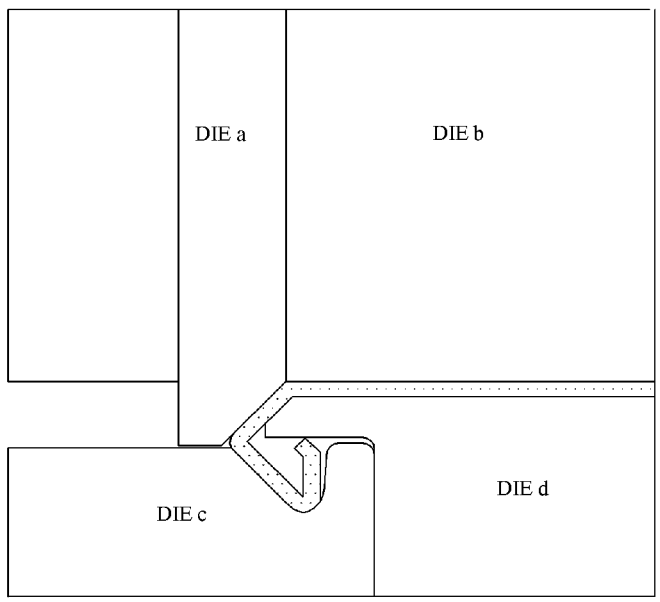

FIGS. 7A to 7C illustrate a die for hemming a back cover and a process of manufacturing the back cover, according to another embodiment of the present invention. Hereinafter, the die for hemming the back cover and the process of manufacturing the back cover, according to the embodiment of the present invention, will be described with reference to FIGS. 7A to 7C.

Referring to FIG. 7A, the die for hemming the back cover includes four dies, i.e., a first upper die (die a), a second upper die (die b), a first lower die (die c), and a second lower die (die d).

The first upper die is disposed on an upper left side of the die, and the second upper die is disposed on an upper right side of the die. The first lower die is disposed on a lower left side of the die, and the second lower die is disposed on a lower right side of the die. The first upper die and the second upper die may be integrally formed as a single die.

The first upper die is formed in a rod type, and a lower portion of the first upper die is inclined so as to form an arrow shape. The second upper die is disposed on the right of the first upper die, and a lower portion of the second upper die has a flat shape. A lower surface of the first upper die is disposed at a relatively lower position than a lower surface of the second upper die. The lower portion of the first upper die is inclined as described above.

An upper portion of the first lower die is cut in a triangular shape so as to form an arrow shape. That is, the first lower die is cut in the triangular shape so as to correspond to the inclined portion of the first upper die.

An upper portion of the second lower die has a flat shape, and an end upper portion of the second lower die protrudes toward the first lower die by a certain length. An end of the protruding portion has an inclined shape so as to correspond to the inclined shape of the first upper die.

An unhemmed portion of the back cover is disposed between the second upper die and the second lower die, and a hemmed portion of the back cover is disposed between the first upper die, the first lower die, and the second lower die. A portion of the back cover, which is disposed between the first upper die and the second lower die, has a first bent portion bent by a certain angle from a portion of the back cover disposed between the second upper die and the second lower die, and a second bent portion disposed at a position spaced apart from the first bent portion by a certain distance. For example, a bending angle may be 45°, and the back cover may have a bending angle of 90° due to the two bent portions, i.e., the first bent portion and the second bent portion.

The first upper die, the second upper die, and the second lower die move downward in a state in which the back cover is disposed between the first upper die, the second upper die, the first lower die, and the second lower die.

Referring to FIG. 7B, when the first upper die, the second upper die, and the second lower die move downward, an end of the back cover comes into contact with the triangular shape of the first lower die. In this state, when the first upper die, the second upper die, and the second lower die move downward, the end of the back cover starts to be bent.

Referring to FIG. 7C, when the downward movement of the first upper die, the second upper die, and the second lower die is completed, the end of the back cover has a bent shape, in particular, an arrow shape.

Figure 8:
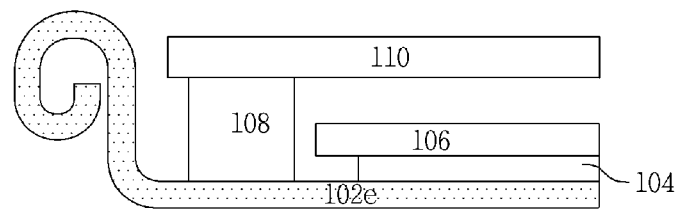
FIG. 8 illustrates a structure of a display according to another embodiment of the present invention.

FIG. 8 illustrates a structure of a display according to another embodiment of the present invention. The display of FIG. 8 differs from the display 100 of FIG. 2 in terms of a hemmed shape of a back cover 102e. That is, the hemmed shape of the back cover 102e of FIG. 8 is a rolled shape.

Figure 9A:
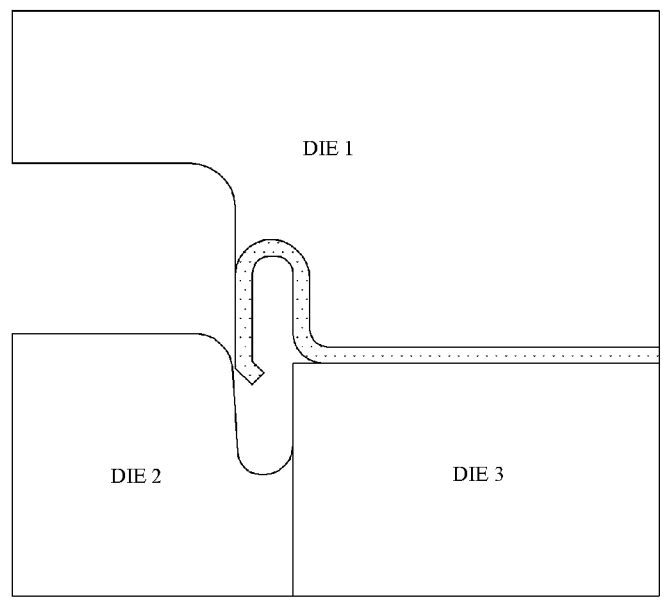
FIGS. 9A to 9C illustrate a die for hemming a back cover and a process of manufacturing the back cover, according to another embodiment of the present invention.
Figure 9B:
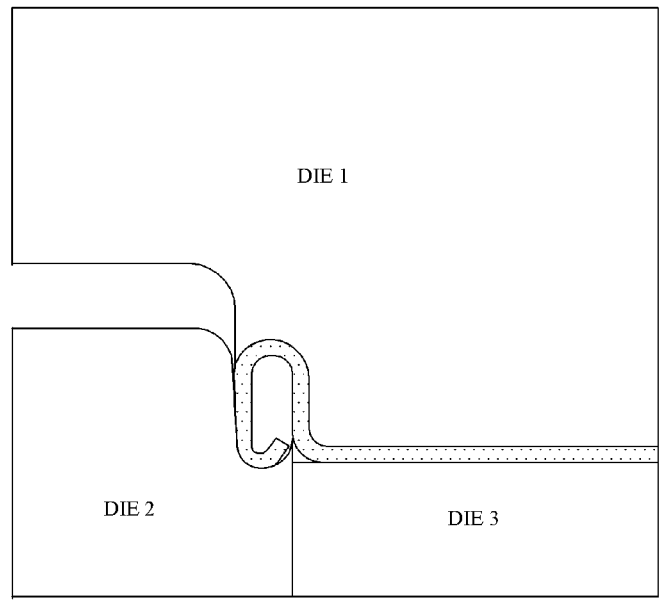
Figure 9C:
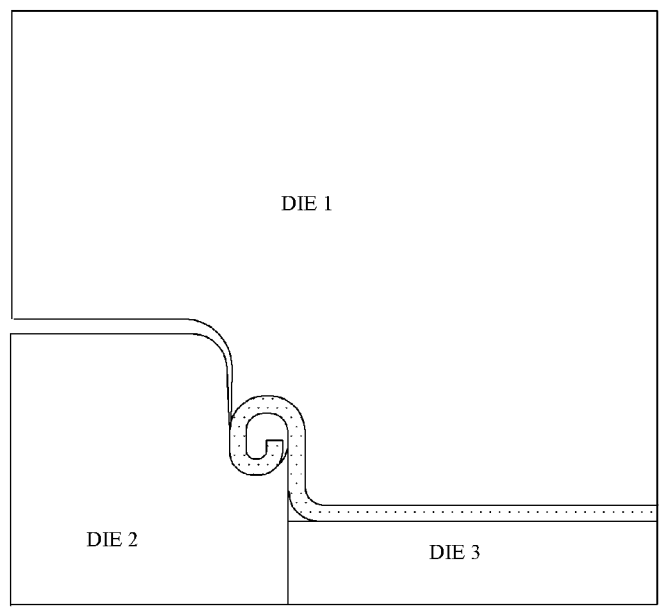

FIGS. 9A to 9C illustrate a die for hemming a back cover and a process of manufacturing the back cover, according to another embodiment of the present invention. Hereinafter, the die for hemming the back cover and the process of manufacturing the back cover, according to the embodiment of the present invention, will be described with reference to FIGS. 9A to 9C.

Referring to FIG. 9A, the die for hemming the back cover includes three dies, i.e., an upper die (die 1), a first lower die (die 2), and a second lower die (die 3). The upper die is disposed on an upper side of the die, the first lower die is disposed on a lower left side of the die, and the second lower die is disposed on a lower right side of the die.

A lower inner side of the upper die has a fan shape with a certain curvature, and an inner side of the fan shape has a flat shape. In particular, the upper die according to the present invention has not one fan shape but two fan shapes. One of the two fan shapes is disposed at a relatively high position and has a central angle of 90°. The other of the two fan shapes is disposed at a relatively low position and has a central angle of 180°.

An upper inner side of the first lower die has a shape corresponding to the fan shape formed in the upper die. An inner side of the shape corresponding to the fan shape has a shape dented downward to a certain length. A portion coming into close contact with the second lower die has a fan shape with a certain curvature.

An upper portion of the second lower die has a flat shape. An unhemmed portion of the back cover is disposed between the upper die and the second lower die, and a hemmed portion of the back cover is disposed between the first lower die and the second lower die.

The upper die and the second lower die move downward in a state in which the back cover is disposed between the upper die, the first lower die, and the second lower die.

Referring to FIG. 9B, when the upper die and the second lower die move downward, an end of the back cover comes into contact with the fan shape of the first lower die. In this state, when the upper die and the second lower die move downward, the end of the back cover starts to be bent.

Referring to FIG. 9C, when the downward movement of the upper die and the second lower die is completed, the end of the back cover has a rolled shape. The moving distance of the upper die and the second lower die in FIGS. 9A to 9C is relatively longer than that in FIGS. 3A to 3C.

Figure 10:
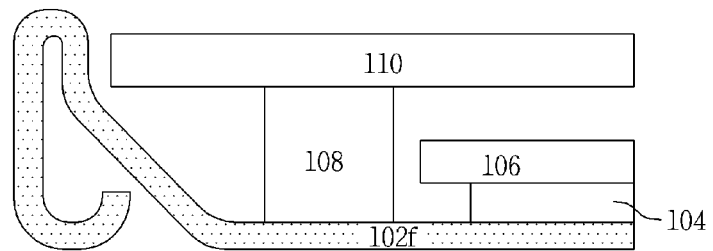
FIG. 10 illustrates a structure of a display according to another embodiment of the present invention.

FIG. 10 illustrates a structure of a display according to another embodiment of the present invention. The display of FIG. 10 differs from the display of FIG. 2 in terms of a hemmed shape of a back cover 102f.

Figure 11A:
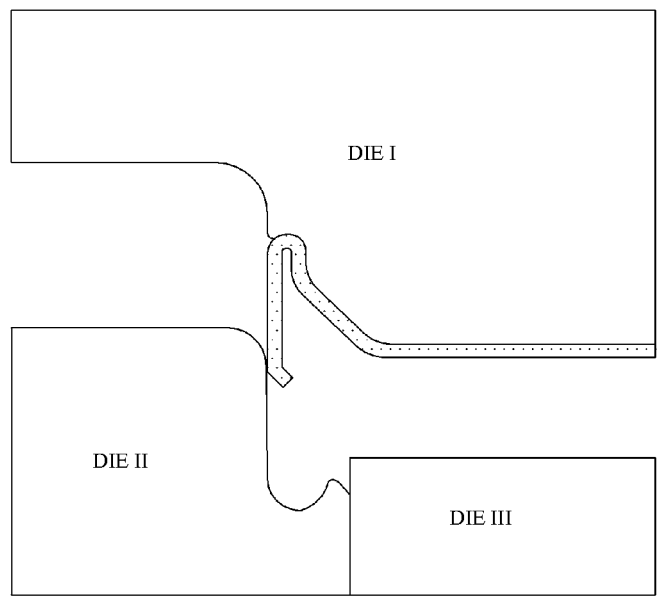
FIGS. 11A to 11C illustrate a die for hemming a back cover and a process of manufacturing the back cover, according to another embodiment of the present invention.
Figure 11B:
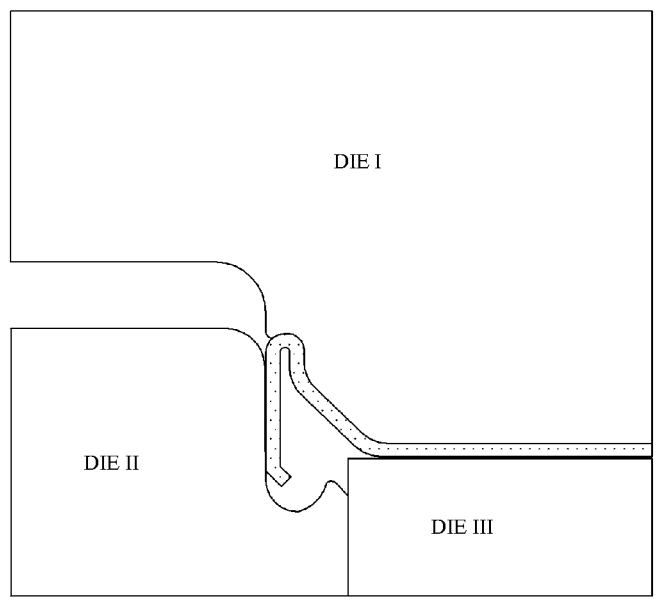
Figure 11C:
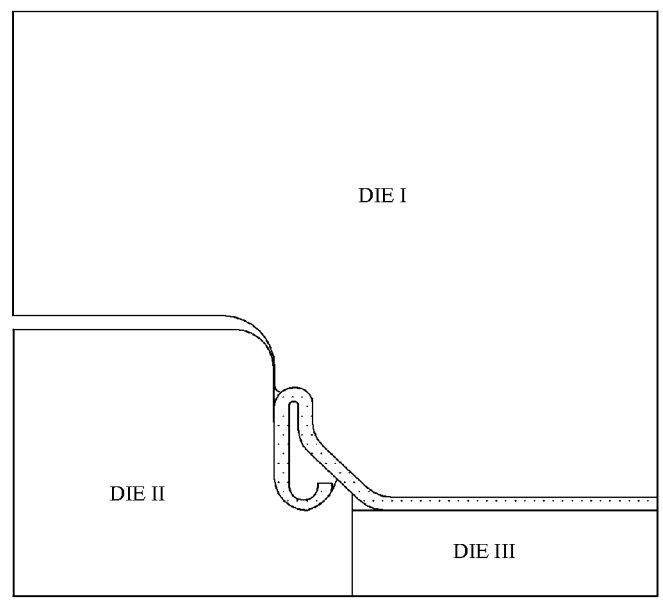

FIGS. 11A to 11C illustrate a die for hemming a back cover and a process of manufacturing the back cover, according to another embodiment of the present invention. Hereinafter, the die for hemming the back cover and the process of manufacturing the back cover, according to the embodiment of the present invention, will be described with reference to FIGS. 11A to 11C.

Referring to FIG. 11A, the die for hemming the back cover includes three dies, i.e., an upper die (die I), a first lower die (die II), and a second lower die (die III). The upper die is disposed on an upper side of the die, the first lower die is disposed on a lower left side of the die, and the second lower die is disposed on a lower right side of the die.

A lower central portion of the upper die has an inclined shape, and an upper end of the inclined shape has a fan shape with a certain curvature. The inclined shape of the upper die has a lower flat shape. In particular, the upper die according to the present invention has not one fan shape but two fan shapes. One of the two fan shapes is disposed at a relatively high position and has a central angle of 90°. The other of the two fan shapes is disposed at a relatively low position and has a central angle greater than 90°.

An upper inner side of the first lower die has a fan shape, and a portion of the first lower die coming into close contact with the second lower die has an inclined shape so as to correspond to the inclined shape of the upper die. The inclined shape of the first lower die continues from the fan shape thereof.

An upper portion of the second lower die has a flat shape.

An unhemmed portion of the back cover is disposed between the upper die and the second lower die, and a hemmed portion of the back cover is disposed between the first lower die and the second lower die.

The upper die and the second lower die move downward in a state in which the back cover is disposed between the upper die, the first lower die, and the second lower die.

Referring to FIG. 11B, when the upper die moves downward, an end of the back cover comes into contact with the fan shape of the first lower die. In this state, when the upper die moves downward, the end of the back cover starts to be bent.

Referring to FIG. 11C, when the downward movement of the upper die and the second lower die is completed, the end of the back cover has a bent shape.

In the method of molding the back cover of the display according to the present invention, the side of the display is finished by hemming the back cover disposed at a relatively lowest portion of the display by using the hemming die. As such, since the back cover is hemmed by using the hemming die, it is unnecessary to use a separate middle cabinet.

As described above, since the separate middle cabinet is not used, it is possible to reduce manufacturing costs of the display and achieve excellent appearance finishing. The back cover may be hemmed in various shapes, thereby improving user satisfaction.

While the embodiments of the present invention have been described with reference to the specific embodiments, it will be apparent to those skilled in the art that various changes and modifications may be made without departing from the spirit and scope of the invention as defined in the following claims.

What is claimed is:

1. A die assembly for molding a back cover of a display, the die assembly comprising:
    an upper die including a first horizontal surface and a first round surface connected to the first horizontal surface, the first horizontal surface having a flat shape, and the first round surface having a certain curvature;
    a first lower die including a first vertical surface and a second round surface connected to the first vertical surface, the first lower die being disposed below the upper die, the first vertical surface being dented downward by a certain length, and the second round surface having a shape corresponding to the first round surface; and
    a second lower die including a third round surface and a second horizontal surface connected to the third round surface, wherein the third round surface faces the first round surface to have substantially the same curvature with the first round surface and protrudes toward the first lower die by a certain length, and the second horizontal surface faces the first horizontal surface to be in parallel with the first horizontal surface and has a flat shape.

2. A method of molding a back cover of a display, the method comprising:
    placing a part of the back cover between the upper die and the second lower die of claim 1 and placing a remaining part of the back cover between the first lower die and the second lower die of claim 1; and
    moving the upper die and the second lower die downward.

3. The die of claim 1, wherein the first and third round surfaces respectively have an approximately quarter circle shape, and the second round surface has an approximately half circle shape.

4. A die assembly for molding a back cover of a display, the die assembly comprising:
    a first upper die including a first inclined surface, the first upper die being formed in a rod type, the first inclined surface having an inclined shape;
    a second upper die including a first horizontal surface, the second upper die being disposed on the right of the first upper die, and the first horizontal surface having a flat shape;
    a first lower die including a second inclined surface, a round surface connected to the second inclined surface, and a first vertical surface connected to the round surface, the second inclined surface being cut in a triangular shape so as to correspond to the inclined shape of the first upper die; and
    a second lower die including a third inclined surface and a second horizontal surface connected to the third inclined surface, wherein the third inclined surface protrudes toward the first lower die by a certain length and has an inclined shape so as to face the first inclined surface to be in parallel with the first inclined surface, and the second horizontal surface corresponds to the first horizontal surface and has a flat shape.

5. A method of molding a back cover of a display, the method comprising:
    placing a part of the back cover between the first upper die, the second upper die, and the second lower die of claim 4 and placing a remaining part of the back cover between the first lower die and the second lower die of claim 4; and
    moving the first upper die, the second upper die, and the second lower die downward.

6. A die assembly for molding a back cover of a display, the die assembly comprising:
    an upper die including a first horizontal surface, a first round surface directly connected to the first horizontal surface, a first vertical surface directly connected to the first round surface and a second round surface connected to the first vertical surface, the first round surface disposed between the first horizontal surface and the first vertical surface, the first horizontal surface having a flat shape;
    a first lower die including a second vertical surface, a third round surface connected to the second vertical surface, and a third vertical surface connected to the third round surface, the second vertical surface being dented downward by a certain length, the third round surface having a shape corresponding to the second round surface; and
    a second lower die including a second horizontal surface, wherein the second horizontal surface faces the first horizontal surface to be in parallel with the first horizontal surface and has a flat shape.

7. A method of molding a back cover of a display, the method comprising:
    placing a part of the back cover between the upper die and the second lower die of claim 6 and placing a remaining part of the back cover to maintain a state of extending downward while coming into close contact with the first round surface of the upper die; and
    moving the upper die and the second lower die downward.

8. The die of claim 6, wherein the first round surface has an approximately quarter circle shape, and the second and third round surfaces respectively have an approximately half circle shape.

9. A die assembly for molding a back cover of a display, the die assembly comprising:
- an upper die including a first horizontal surface, a first inclined surface directly connected to the first horizontal surface, a first vertical surface directly connected to the first inclined surface, and a first round surface connected to the first vertical surface, the first inclined surface disposed between the first horizontal surface and the first vertical surface, the first horizontal surface having a flat shape, the first inclined surface having an inclined shape, and the first round surface having a certain curvature;
- a first lower die including a second vertical surface, a second round surface connected to the second vertical surface, and a second inclined surface connected to the second round surface, the first lower die being disposed on a lower left side of the upper die, the second round surface having a certain curvature, and the second inclined surface having an inclined shape; and
- a second lower die including a second horizontal surface and disposed on a lower right side of the upper die, wherein the second horizontal surface faces the first horizontal surface to be in parallel with the first horizontal surface and has a flat shape.

10. A method of molding a back cover of a display, the method comprising:
- placing a part of the back cover between the upper die and the second lower die of claim 9 and placing a remaining part of the back cover to maintain a state of extending downward while coming into close contact with the inclined shape and the first round surface of the upper die;
- moving the upper die downward such that both sides of the back cover come close contact with the upper die and the second lower die, respectively; and
- moving the upper die and the second lower die downward in a state in which the both sides of the back cover come into close contact with the upper die and the second lower die.

11. The die of claim 9, wherein the first and second round surfaces respectively have an approximately half circle shape.

* * * * *